(12) United States Patent
Koyama et al.

(10) Patent No.: US 11,337,307 B2
(45) Date of Patent: May 17, 2022

(54) LIGHT-EMITTING DEVICE, AND METHOD FOR MANUFACTURING LIGHT-EMITTING DEVICE

(71) Applicant: CCS Inc., Kyoto (JP)

(72) Inventors: Takahiko Koyama, Kyoto (JP); Takashi Osawa, Kyoto (JP)

(73) Assignee: CCS INC., Kyoto (JP)

( * ) Notice: Subject to any disclaimer, the term of this patent is extended or adjusted under 35 U.S.C. 154(b) by 18 days.

(21) Appl. No.: 16/957,207

(22) PCT Filed: Dec. 27, 2018

(86) PCT No.: PCT/JP2018/048260
§ 371 (c)(1),
(2) Date: Jun. 23, 2020

(87) PCT Pub. No.: WO2019/131916
PCT Pub. Date: Jul. 4, 2019

(65) Prior Publication Data
US 2020/0396838 A1    Dec. 17, 2020

(30) Foreign Application Priority Data

Dec. 28, 2017    (JP) .............................. JP2017-254357

(51) Int. Cl.
*H05K 1/11* (2006.01)
*F21V 3/02* (2006.01)
(Continued)

(52) U.S. Cl.
CPC ................ *H05K 1/118* (2013.01); *F21V 3/02* (2013.01); *H01L 25/0753* (2013.01);
(Continued)

(58) Field of Classification Search
CPC ........ H05K 1/118; H05K 1/189; H05K 1/181; H05K 1/02; H05K 1/18;
(Continued)

(56) References Cited

U.S. PATENT DOCUMENTS 6,070,986 A * 6/2000 Yoneda .............. G01N 21/8806
362/33
6,533,429 B2 * 3/2003 Yoneda .............. G01N 21/8806
362/600
(Continued)

FOREIGN PATENT DOCUMENTS

JP        2975893 B2    11/1999
JP    2010-135309 A     6/2010
(Continued)

OTHER PUBLICATIONS

ISA Japan Patent Office, International Search Report Issued in Application No. PCT/JP2018/048260, dated Mar. 26, 2019, WIPO, 4 pages.
(Continued)

*Primary Examiner* — Joseph L Williams
*Assistant Examiner* — Jose M Diaz
(74) *Attorney, Agent, or Firm* — Alleman Hall Creasman & Tuttle LLP

(57) ABSTRACT

To provide a highly reliable lighting-emitting device that hardly causes defects in case a wiring board is bent, while realizing high brightness by increasing a mounting density of surface-mounted LEDs on a wiring board that is rounded into a truncated cone shape or a cylinder shape, the light-emitting device comprises: the wiring board, a plurality of sets of pads arranged in a line along a circumferential direction of the wiring board, and a plurality of surface-mounted LEDs respectively fixed to the pads. The device satisfies y≤−1.04x+1.80, where (L) is a length of the cir-
(Continued)

cumference of the wiring board with the pads, (y) (y=s/L) is a ratio of a total sum (s) of the lengths in the circumferential direction of the pads relative to the circumferential length (L), and (x) is a curvature of the wiring board where the pads are arranged.

10 Claims, 5 Drawing Sheets

(51) Int. Cl.
    *H01L 25/075*     (2006.01)
    *H05K 1/18*     (2006.01)
    *F21Y 107/10*     (2016.01)
    *F21Y 115/10*     (2016.01)

(52) U.S. Cl.
    CPC .......... *H05K 1/189* (2013.01); *F21Y 2107/10* (2016.08); *F21Y 2115/10* (2016.08); *H05K 1/181* (2013.01); *H05K 2201/09409* (2013.01); *H05K 2201/10106* (2013.01)

(58) Field of Classification Search
    CPC .......... H05K 2201/09409; H05K 2201/10106; H05K 3/3442; H05K 3/3485; H05K 3/305; F21V 3/02; F21V 19/003; H01L 25/0753; F21Y 2107/10; F21Y 2107/70; F21Y 2115/10; G01N 21/8806; F21K 9/00; F21K 9/90

See application file for complete search history.

(56) References Cited

U.S. PATENT DOCUMENTS

| | | | |
|---|---|---|---|
| 10,605,412 B1* | 3/2020 | Garber | F21V 23/005 |
| 2006/0061286 A1* | 3/2006 | Coushaine | F21K 9/00 |
| | | | 315/76 |
| 2011/0220958 A1* | 9/2011 | Yoneda | G01N 21/8806 |
| | | | 257/99 |
| 2015/0308628 A1 | 10/2015 | Athalye et al. | |
| 2017/0200706 A1 | 7/2017 | Lee | |

FOREIGN PATENT DOCUMENTS

| | | |
|---|---|---|
| JP | 2010-287353 A | 12/2010 |
| WO | 2013040506 A1 | 3/2013 |
| WO | 2017133770 A1 | 8/2017 |

OTHER PUBLICATIONS

European Patent Office, Extended European Search Report Issued in Application No. 18897322.6, dated Oct. 25, 2021, Germany, 8 pages.

* cited by examiner

US 11,337,307 B2

LIGHT-EMITTING DEVICE, AND METHOD FOR MANUFACTURING LIGHT-EMITTING DEVICE

FIELD OF THE ART

This invention relates to a light-emitting device wherein surface mounted LEDs (light-emitting diodes) are fixed to a wiring board that is curved to a predetermined shape, and a method for manufacturing the light-emitting device.

BACKGROUND ART

This kind of the light-emitting device was first developed by the applicant of this invention (refer to the patent document 1). Conventionally, a belt-shaped flexible wiring board having, for example, a partial toric shape is provided with through holes into each of which a lead terminal of a shell type LED is inserted and soldered, and then the wiring board is curved with each end making an abutting contact with each other so as to be in a truncated cone shape.

Meanwhile, recently it is attempted that surface-mounted LEDs having higher power than that of the shell type LEDs are applied to the light-emitting device so as to irradiate the light having further higher brightness.

However, there will be various problems if the surface-mounted LEDs are soldered on the wiring board with the same mounting density as that of the shell type LEDs. For example, if the wiring board is rounded in a truncated cone shape or a cylindrical shape after a plurality of surface-mounted LEDs are soldered on the flat wiring board, cracking might occur at a soldered portion when the wiring board is bent. In addition, since a bending tolerance at a portion where the surface-mounted LEDs are fixed to the wiring board by means of soldering becomes small, when the wiring board is bent, a crack might occur on the wiring board.

Theses problems result in that an area where the surface-mounted LEDs are fixed to the wiring board is bigger than the area where the shell type LEDs are fixed by soldering or that an area where the wiring board is difficult to bend is wide due to the rigidity of the surface-mounted LEDs themselves.

Even though the surface-mounted LEDs are soldered after the wiring board is rounded into the truncated shape or the cylindrical shape, if the mounting density of the surface-mounted LEDs is too high relative to a bent degree of the wiring board, the surface-mounted LEDs might flake away because an area where the surface-mounted LEDs are soldered on the wiring board is not sufficiently wide.

In order to prevent the light-emitting device from having low reliability because of the above-mentioned problems, the mounting density of the surface-mounted LEDs must be significantly reduced compared with the shell type LEDs.

If the mounting density is reduced, a portion where no surface-mounted LED is mounted becomes wide so that the portion absorbs bending of the wiring board even though the wiring board is bent, resulting in no problem. However, if the mounting density is overly reduced in order to secure safely, it becomes difficult to irradiate the light with a high brightness.

In addition, even though the mounting density of the surface-mounted LEDs on the wiring board is low, if the wiring board is bent too much, a crack on the wiring board or disconnection of the wire might occur because the wiring board itself exceeds an allowable bending limit.

PRIOR ART DOCUMENTS

Patent Document

Patent document 1: Japanese Unexamined Patent Application Publication No. 2975893

DISCLOSURE OF THE INVENTION

Problems to be Solved by the Invention

The present invention intends to solve all of the problems and a main object of this invention is to provide a highly reliable light-emitting device that hardly causes defects when bending a wiring board, while realizing high brightness by increasing the density with which surface-mounted LEDs are mounted on the wiring board that is rounded into a predetermined shape.

Means to Solve the Problems

More specifically, the light-emitting device in accordance with this invention comprises a flexible wiring board curved to a predetermined shape, a plurality of sets of pads arranged so as to form a line along a circumferential direction which is a direction of at least a curved part on the curved wiring board, and a plurality of surface-mounted LEDs (light-emitting diodes) each of which is fixed to each of the plurality of the sets of the pads respectively, and is characterized by that $y \leq -1.04x+1.80$ is satisfied, where L is a length of the circumference of the part where the plurality of the sets of the pads form the line on the curved wiring board, y ($y=s/L$) is a ratio of a total sum s of the lengths in the circumferential direction of the plurality of the sets of the pads relative to the circumferential length L, and x is a curvature of the part where the plurality of the sets of the pads form the line on the curved wiring board.

In addition, a method for manufacturing a light-emitting device in accordance with this invention is a method for manufacturing the light-emitting device that comprises a flexible wiring board curved to a predetermined shape, a plurality of sets of pads arranged so as to form a line along a circumferential direction as being a direction of at least a curved part on the curved wiring board, and a plurality of surface-mounted LEDs each of which is fixed to each of the plurality of the sets of the pads respectively, and is characterized by that $y \leq -1.04x+1.80$ is satisfied, where L is a length of the circumference of the part where the plurality of the sets of the pads form the line on the curved wiring board, y ($y=s/L$) is a ratio of a total sum s of the lengths in the circumferential direction of the plurality of the sets of the pads relative to the circumferential length L, and x is a curvature of the part where the plurality of the sets of the pads form the line on the curved wiring board.

As a result of keen examinations by the applicant of this invention, the light-emitting device and its manufacturing method were first developed by finding a relation between the curvature of the portion of the rounded wiring board where the surface-mounted LEDs are mounted and the upper limit of the mounting density of the surface-mounted LEDs that causes malfunction on the rounded wiring board.

If the mounting density of the surface-mounted LEDs is set to satisfy the above-mentioned expression, it is possible for the ring-shaped light-emitting device having an arrangement that the curved surface of, for example, a truncated cone shape or a cylindrical shape is formed by bending the wiring board after the surface-mounted LEDs are mounted on the wiring board to prevent the curved wiring board from being cracked or from being broken while increasing the mounting density of the surface-mounted LEDs as much as possible. In addition, even if the surface-mounted LEDs are fixed on the wiring board after the wiring board is bent to be in a truncated cone shape or a cylindrical shape, it is also possible to prevent the surface-mounted LEDs from flaking, the curved wiring board from being cracked or the wiring from being disconnected after completion of the light-emitting device while increasing the mounting density of the surface-mounted LEDs.

As a result of this, if the surface-mounted LEDs are used for the light-emitting device, the light-emitting device can be highly reliable while realizing a higher brightness than a conventional light-emitting device with shell-type LEDs are mounted.

As a concrete example of the light-emitting device that can improve the reliability of mounting the surface-mounted LEDs on the wiring board in accordance with this invention represented is that the predetermined shape is a truncated cone shape, a partially truncated cone shape, a cylindrical shape, a partially cylindrical shape or a semi-cylindrical shape.

Regardless of the value of the curvature (x), in order to make it possible to satisfy the upper limit of the mounting density that realizes the highly reliable light-emitting device, $y \leq 0.745$ may be satisfied. In addition, in order to further improve the reliability to not drop the surface-mounted LEDs even though some shock is applied to the light-emitting device, $y \leq -24.8x+1.63$ or $y \leq 0.72$ may be satisfied In order to satisfy the lower limit of the mounting density as the ring-shaped light emitting device that realizes the brightness that is higher than that of a conventional light-emitting device, $0.35 \leq y$ may be satisfied.

If the plurality of the sets of the pads are arranged in a plurality of lines in the circumferential direction of the rounded wiring board, the surface-mounted LEDs are arranged to correspond to each of the sets of the pads, and $y \leq -1.04x+1.80$ is satisfied in each line, it is possible to realize the optimal mounting density for each line so as to realize the high brightness without causing defects.

Effect of this Invention

In accordance with the light-emitting device of this invention, since the light-emitting device is so configured to satisfy $y \leq -1.04x+1.80$, it is possible to secure high reliability with hardly causing defects, while realizing high brightness by increasing the mounting density of the surface-mounted LEDs to near the limit.

DESCRIPTION OF REFERENCE CHARACTERS

Figure 1:
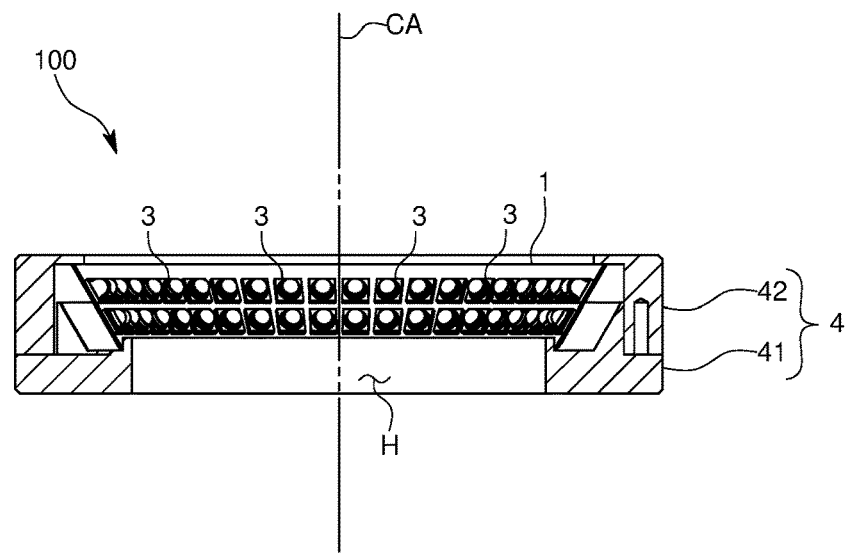
FIG. 1 is a schematic longitudinal section view of a light-emitting device in accordance with one embodiment of this invention.

100 . . . light-emitting device
1 . . . wiring board
2 . . . pad
21 . . . electrode pad
22 . . . heat-dissipating pad
3 . . . surface-mounted LED

BEST MODES OF EMBODYING THE INVENTION

Figure 2:
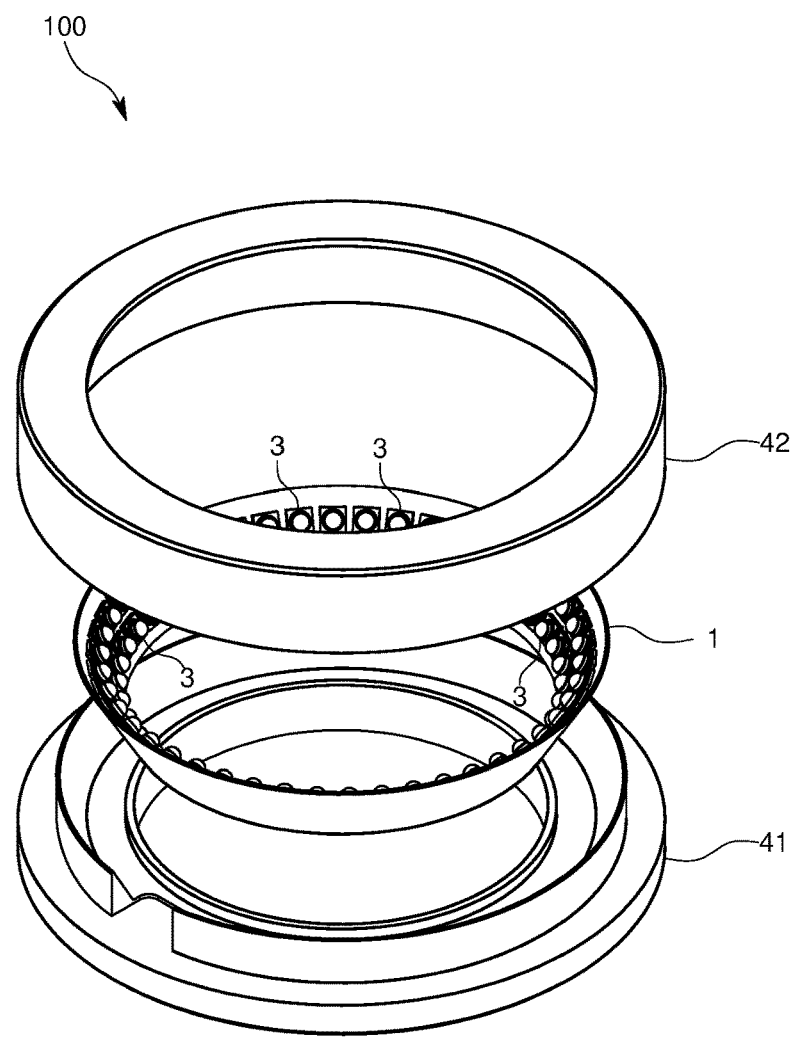
FIG. 2 is a schematic partially exploded perspective view of the light-emitting device of this embodiment.

A light-emitting device 100 in accordance with one embodiment of this invention will be explained with reference to drawings. As shown in FIG. 1 and FIG. 2, the light-emitting device 100 of this embodiment has an arrangement wherein a plurality of surface-mounted (SMD) LEDs 3 are mounted on an inside surface of a flexible wiring board 1 that is rounded into a truncated cone shape. The wiring board 1 that is rounded into the truncated cone shape is housed inside of a case 4 of a generally toric shape.

The case 4 comprises a base member 41 that has a through bore (H) in a center of which and on which an outside surface of the wiring board 1 rounded into the truncated cone shape is placed, and a generally thin and cylindrical cover member 42 mounted on the base member 41 with the wiring board 1 sandwiched between the cover member 42 and the base member 41. The through bore (H) is used for visual inspecting or imaging an object to be inspected in case that the light-emitting device 100 is used for inspection.

Figure 3A:
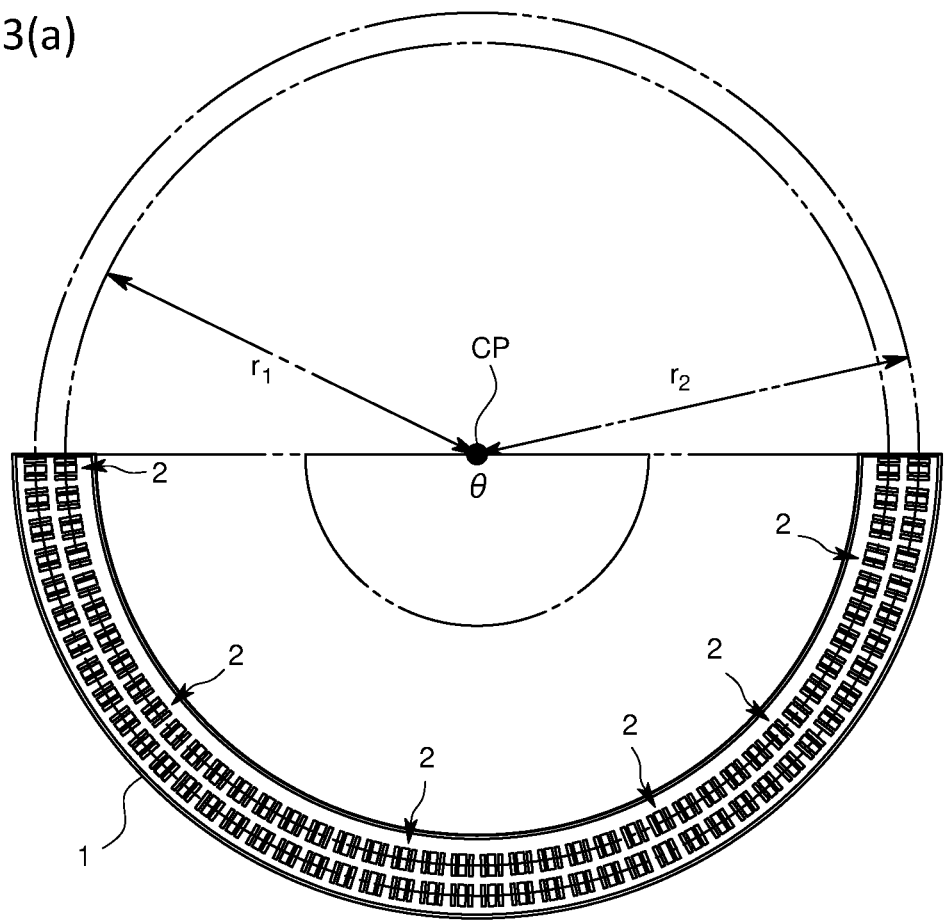
FIGS. 3(a) and 3(b) are schematic views showing a state of a wiring board in a flat state of this embodiment.

The wiring board 1 is, as shown in FIG. 3(a), of a partially tonic belt shape in a flat state prior to being rounded, and a plurality of surface-mounted LEDs 3 are fixed by soldering to a surface to be a curved inside surface of the wiring board 1 rounded to be the truncated cone shape. In this embodiment, the surface-mounted LEDs 3 are arranged in both an inner circumferential side and an outer circumferential side, whose radius differs each other, of the wiring board 1 in the flat state so that two lines of the surface-mounted LEDs 3 are formed in parallel. Then, a plurality sets of the pads 2 are arranged side by side along a circumferential direction on parts of the radius $r=r_1$, and $r_2$ ($r_1 \leq r_2$) from a center point on the flat wiring board 1.

Figure 3B:
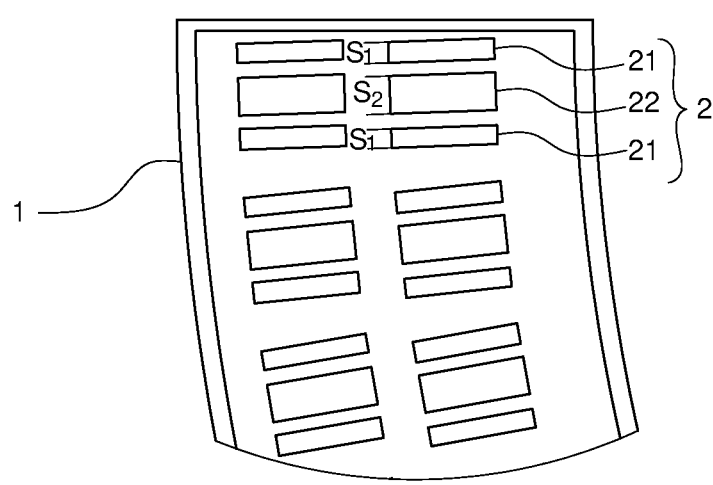
Figure 4:
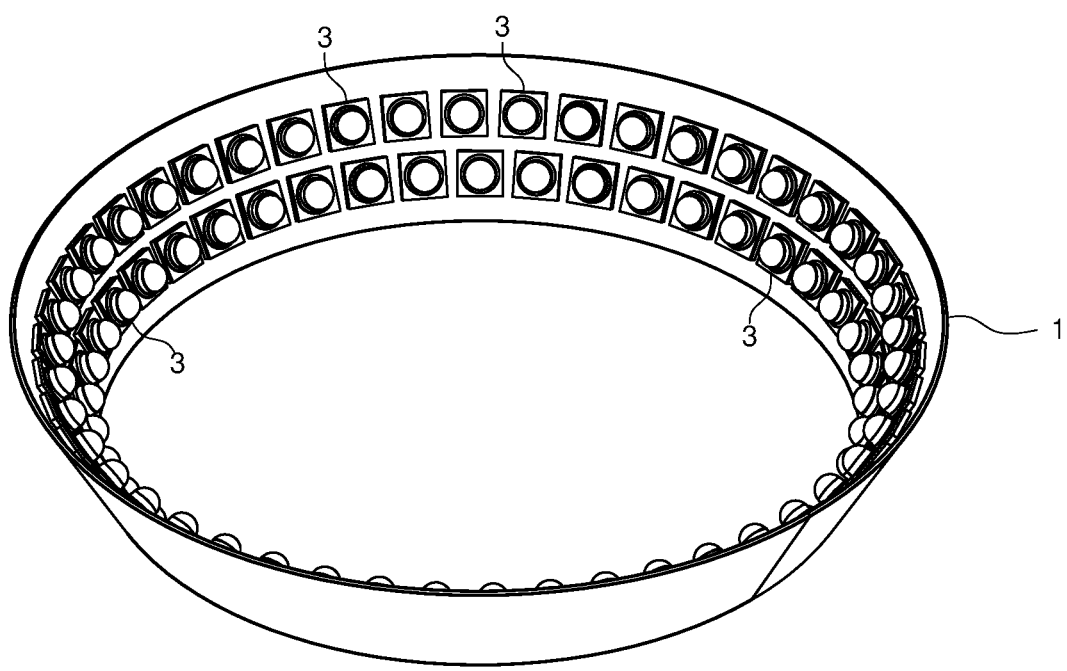
FIG. 4 is a schematic perspective view showing a state that a wiring board on which surface-mounted LEDs (light-emitting diodes) are mounted and that is rounded into a truncated cone shape in accordance with this embodiment.

Each set of the pads 2 is, as shown in a partially enlarged view in FIG. 3(b), made of three pieces of rectangular belt-shaped copper foil each extending toward the radial direction on the flat wiring board 1. With paying attention on one set of the pad 2, two thin copper foil straps locating outer sides of the pad 2 are electrode pads 21, 21 on which electrode parts of the surface-mounted LEDs 3 are placed, and a wide copper foil strap locating at a center of the pad 2 is a heat dissipating pad 22. In this embodiment, for example, cream solder is applied to the two electrode pads 21 locating at the outer sides and the heat dissipating pad 22 for the set of the pad 2. The surface-mounted LEDs 3 are placed on the sets of the pads 2 to which the cream solder is applied and then fixed by reflow.

Next, a range of a mounting density of the surface-mounted LEDs 3 in a circumferential direction on the wiring board 1 that makes the light-emitting device 100 feasible will be explained. The circumferential direction here is a direction in which the wiring board 1 is curved or rounded. In this embodiment, the feasible range of the mounting density of the surface-mounted LEDs 3 as the light-emitting device 100 is specified with a variable of y=s/L as being a ratio of a total sum (s) of a length of the sets of the pads 2 to a length (L) of a partial arc of the surface-mounted LEDs 3 arranged in a line along the circumferential direction on the wiring board 1 rounded in the truncated cone shape, and a variable of a curvature (x) in the circumferential direction of a part where the surface-mounted LEDs 3 are arranged.

In the following explanation, as shown in FIG. 3, a distance between a center point (CP) of the flat wiring board 1 and a center of the pad 2 in the radial direction arranged on the wiring board 1 is defined as the radius (r). Furthermore, a radius of curvature 1/x as being a reciprocal number of the curvature (x) is specified by a normal line to a curved surface of the wiring board 1 in the rounded state (refer to FIG. 5).

Figure 5:
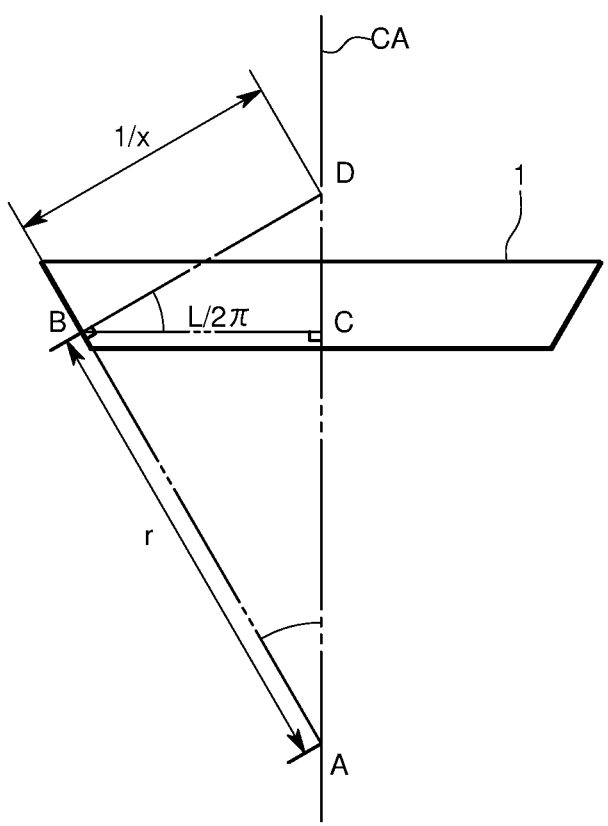
FIG. 5 is a schematic view showing a relationship between each size of the wiring board rounded into a truncated cone shape in accordance with this embodiment.

Based on a geometrical relation, the center point (CP) of the flat wiring board 1 as shown in FIG. 3(a) corresponds to an imaginary apex (A) in case that an apex side exists in the wiring board 1 that is rounded in the truncated cone shape shown in FIG. 5, and the radius (r) becomes a length of a generating line between the imaginary apex (A) and a point (B). In case that an intersection point wherein a perpendicular line is drawn down from the point (B) to a center axis (CA) is set to be (C), a length of a line segment (BC) becomes a radius of a circle having a circumference (L) that is the same as a length (L) of a circular arc of the radius (r) from the center point (CP) of the flat state wiring board 1. More specifically, in case that a center angle of a partially toric wiring board 1 in the flat state is $\theta$ (rad), the length (L) of the arc is calculated by L=r$\theta$. Accordingly, the length of the line segment (BC) is expressed by L/2 $\pi$=r$\theta$/2 $\pi$.

As shown in FIG. 5, a radius of curvature 1/x becomes equal to a distance (BD) between the point (B) and an intersection point (D) in case a point where a vertical line from the point (B) on a surface of the wiring board 1 intersects the center axis (CA) is set to be (D). The length of (BD) can be obtained because a triangle (ABC) and a triangle (ADB) are similar figures. More specifically, the radius of curvature (1/x) can be expressed as $1/x=r\theta/\sqrt{(4\pi^2-\theta^2)}$ by the use of the radius (r) and the center angle ($\theta$) as being parameters of the wiring board 1 in the flat state. Based on this expression, it is possible to obtain the curvature (x) of a part where the lines of the sets of the pads 2 or the surface-mounted LEDs 3 are formed on the wiring board 1 that is rounded in the truncated cone shape.

In addition, (s) is calculated based on a total sum of widths of the sets of the pads 2 arranged in the direction along the arc of the circle shown by a two-dot chain line in FIG. 3. For example, in case that a width in a circumferential direction of the electrode pad 21 is ($s_1$), a width in the circumferential direction of the dissipating pad 22 is ($s_2$) and a number of sets of the pads 2 is (n), (s) is expressed by $s=n(2s_1+s_2)$. Since the same number of the surface-mounted LEDs 3 as that of the number of the sets of the pads 2 are mounted, the bigger y=s/L is, the shorter the distance between the surface-mounted LED 3 and the adjacent surface-mounted LED 3 in the circumferential direction becomes, so that the density of the mounted surface-mounted LEDs 3 in the circumferential direction becomes high.

Figure 6:
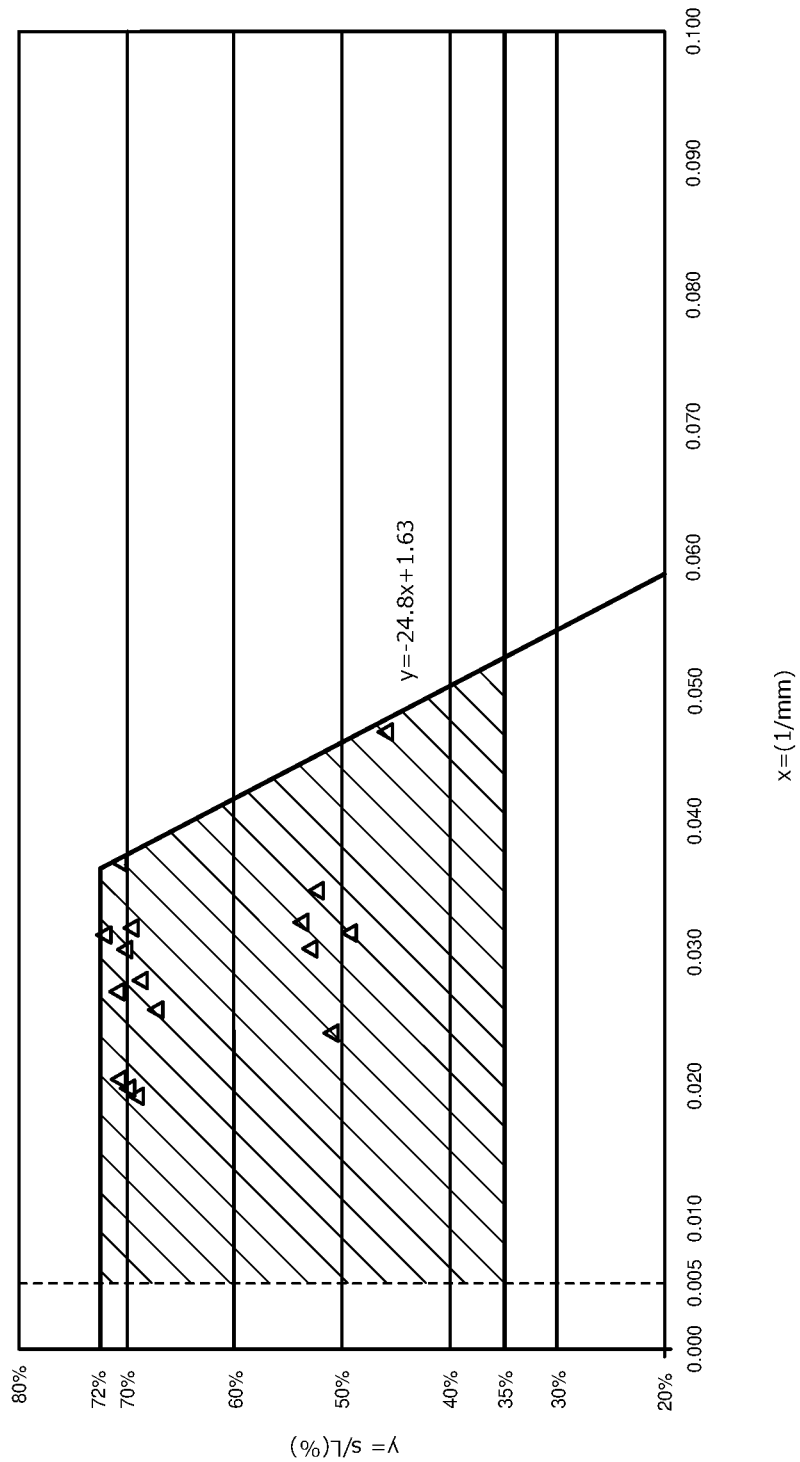
FIG. 6 is a graph showing a relationship between a curvature and a mounting density of the wiring board in accordance with this embodiment.

In this embodiment, as shown in a graph in FIG. 6, in case that the above-mentioned curvature (x) (1/mm) is on an X axis and the mounting density y=s/L (%) is on a Y axis, the mounting density in the circumferential direction of the surface-mounted LEDs 3 is set to be in an area shown by hatched lines in FIG. 6. In addition, each line of the sets of the pads 2 corresponding to the inner side radius $r=r_1$ of the flat wiring board 1 and the outer side radius $r=r_2$ is also set to be included in the area shown by the hatched lines.

Concretely, the area shown by the hatched lines is an area that satisfies y$\leq$−24.8x+1.63, 0.35$\leq$y$\leq$0.72, and 0.005$\leq$x simultaneously. The wiring board 1 is actually manufactured with changing a combination of the curvature (x) and the ratio (y) of the total sum (s) of the widths in the circumferential direction of the sets of the pads 2 relative to the length (L) of the arc, and this area is set based on a result wherein no malfunction occurs although the wiring board 1 is curved and rounded. The mounting density with which the wiring board 1 can be actually manufactured without malfunction is shown by triangle dots in FIG. 6.

It is possible to avoid an occurrence of cracking in the solder on the wiring board 1 that is rounded and curved in the truncated cone shape and to prevent breakage of the wiring board 1 by adjusting the mounting density at a time of arranging the surface-mounted LEDs 3 along the circumferential direction on the wiring board 1 so as to be included in the area shown by the hatched lines.

In addition, if the mounting density of the surface-mounted LEDs 3 falls within this area, it becomes possible for the light-emitting device 100 using the surface-mounted LEDs 3 to attain luminance equal to or bigger than that of the ring type light-emitting device using shell type LEDs.

Within the hatched area shown in FIG. 6, it is possible to enjoy the effect that the mounting density of the surface-mounted LEDs 3 is increased and occurrence of malfunction is suppressed in various manufacturing methods such that the wiring board 1 is rounded after mounting the surface-mounted LEDs 3 on the wiring board 1 or the surface-mounted LEDs 3 are mounted on the wiring board 1 after the wiring board 1 is rounded.

Other embodiments will be explained.

The wiring board is rounded in the truncated cone shape in the above-mentioned embodiment, however, the present claimed invention may be applied to a wiring board that is rounded into a cylindrical shape by rounding a flexible belt-shaped wiring board with its one edge surface making an abutting contact with the other edge surface. In case that the wiring board is rounded into a cylindrical shape, the radius of curvature 1/x in a circumferential direction where the sets of the pads and the surface-mounted LEDs are arranged coincides with the radius of the cylindrical shape formed by the wiring board. Accordingly, it becomes possible to set the mounting density that can be configured as the light-emitting device for every curvature (x). In addition, the wiring board may be curved to be a partially truncated cone shape that is one forth or a half of the circumference of the truncated cone shape. For example, one truncated cone shape may be formed by using two wiring boards each of which is rounded into a partially truncated cone shape having a half circumference. In addition, similarly, the wiring board may be rounded into a partial cylindrical shape, or may be rounded into a semi-cylindrical shape.

In order to obtain a ratio of the total length (s) in the circumferential direction of the sets of the pads that occupy relative to the length (L) of the arc, if all back surface sides of the surface-mounted LEDs are soldered, a part where the surface-mounted LEDs are soldered may be counted as the pad. In addition, the heat dissipating pad may be fixed by a heat conductive adhesive as well soldered. In accordance with this invention, the mounting density of the surface-mounted LEDs is evaluated by the ratio (y) of the total length (s) of the sets of the pads that occupy relative to the length (L) of the partial arc where the sets of the pads or the surface-mounted LEDs are arranged in line in the circumferential direction on the wiring board. Accordingly, irrespective of the type of the sets of the pads or the method for fixing the sets of the pads, it is possible to define a mountable range by evaluating a range where the wiring board and the surface-mounted LEDs are fixed (for example, in case that the surface-mounted LEDs make contact with the heat dissipating pad through a thermal grease without being fixed by soldering or the like, the total length in the circumferential direction of the surface-mounted LEDs is not included in the total length (s)). A method for fixing the surface-mounted LEDs to the wiring board is not limited to soldering, and may be, for example, an electric conductive adhesive.

Figure 7:
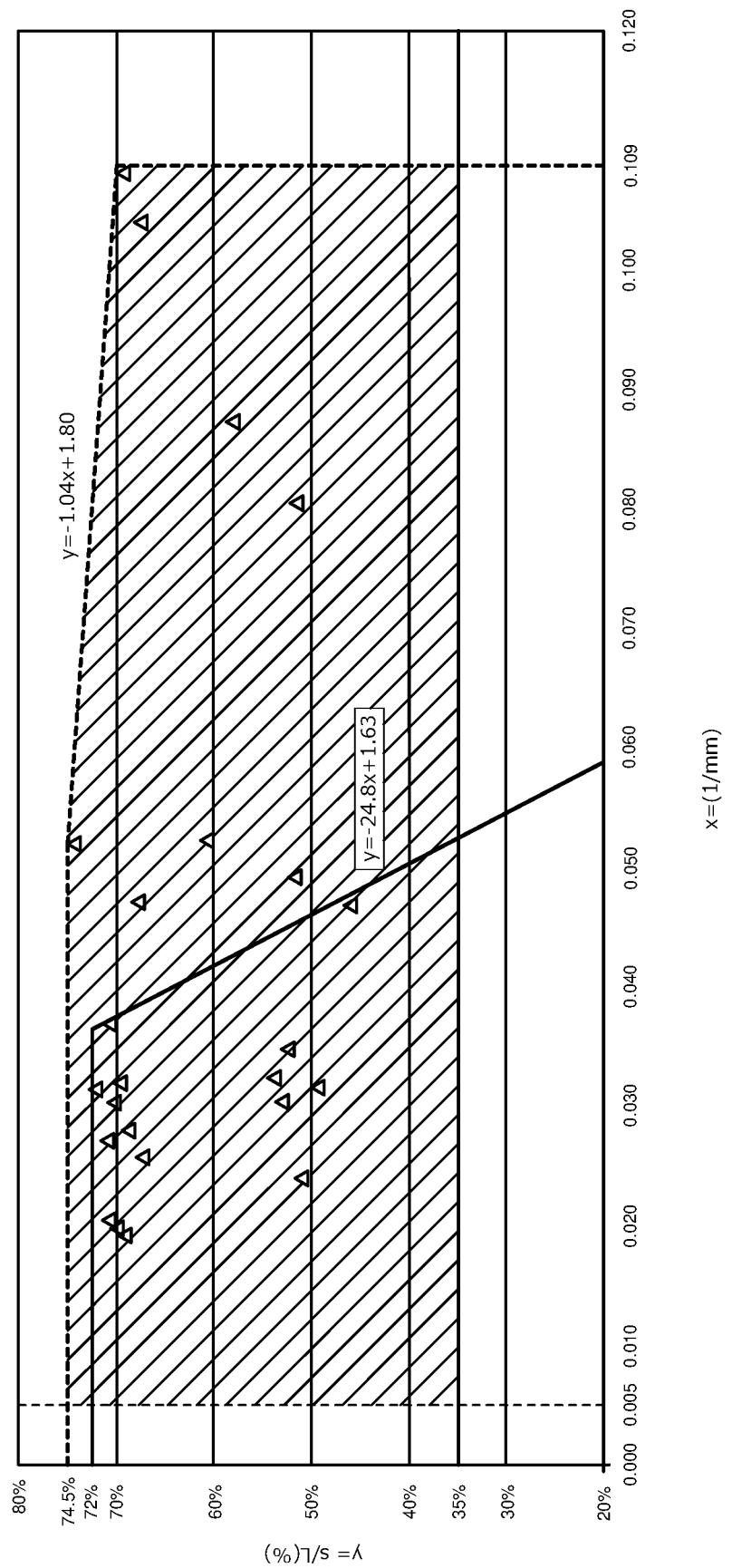
FIG. 7 is a graph showing a relationship between a curvature and a mounting density of the wiring board in accordance with another embodiment of this invention.

The light-emitting device shown in the above-mentioned embodiment is one example, and a number of the lines where the surface-mounted LEDs are arranged may be only one, or may be a plurality such as three or more than three. In case of the plurality of lines, it may be accepted as far as at least one line satisfies a relationship shown in FIG. 6 or a relationship shown in FIG. 7, to be described later. A shape of the wiring board is not limited to a partially annular shape shown in the above-mentioned embodiment, and may be a partially annular shape whose center angle is an obtuse angle, an acute angle or 180 degree. In addition, the surface-mounted LEDs arranged in the circumferential direction are not necessarily mounted all over the circumferential part, and may be mounted at least a part of the circumferential part.

An extending direction of the sets of the pads to the wiring board is not limited to the direction shown in the above-mentioned embodiment, and the sets of the pads may extend in the circumferential direction of the partially annular wiring board.

The light-emitting device in accordance with this invention is not limited to the light-emitting device having an arrangement wherein the surface-mounted LEDs are mounted with the mounting density shown in the above-mentioned embodiment. Concretely, in case that the curvature (x) (1/mm) is plotted on the X axis and the mounting density y=s/L (%) is plotted on the Y axis, the surface-mounted LEDs may be mounted with the mounting density that falls within a range that satisfies the relation between the curvature (x) and the mounting density (y) in an area shown by hatched lines in a graph of FIG. 7. Concretely, the present inventors found for the first time that the surface-mounted LEDs can be mounted with a predetermined reliability if the surface-mounted LEDs are mounted on a curved surface within an area indicated by $y \leq -1.04x+1.80$, $0.35 \leq y \leq 0.745$, and $0.005 \leq x \leq 0.109$. More specifically, in case that at least a part of the surface-mounted LEDs arranged on a flat surface that is cut so as to contain a curved part on the curved wiring board satisfies the relationship of the surface-mounting density indicated in FIG. 6 or FIG. 7, the effect as this invention can be satisfied.

In addition, the present claimed invention may be variously combined or modified without departing from a spirit of the invention.

POSSIBLE APPLICATIONS IN INDUSTRY

In accordance with this invention, it is possible to provide a light-emitting device that hardly causes defects, while realizing high brightness by increasing a mounting density of surface-mounted LEDs to near the limit.

The invention claimed is:

1. A light-emitting device comprising
a flexible wiring board curved to a predetermined shape,
a plurality of sets of pads mounted on a top surface of the flexible wiring board and arranged so as to form a line along a circumferential direction of a curved part of the curved wiring board having the predetermined curved shape, and
a plurality of surface-mounted LEDs (light-emitting diodes) each of which is fixed to a top surface of each of the plurality of the sets of the pads respectively, wherein
$y \leq -1.04x+1.80$ is satisfied, where L is a length of the circumference of the part where the plurality of the sets of the pads form the line on the curved wiring board, y (y=s/L) is a ratio of a total sum s of the lengths in the circumferential direction of the plurality of the sets of the pads to the circumferential length L, and x is a curvature of the part where the plurality of the sets of the pads form the line on the curved wiring board.

2. The light-emitting device described in claim 1, wherein the predetermined shape is a truncated cone shape, a partially truncated cone shape, a cylindrical shape, a partially cylindrical shape, or a semi-cylindrical shape.

3. The light-emitting device described in claim 1, wherein $y \leq -24.8x+1.63$ is satisfied.

4. The light-emitting device described in claim 1, wherein $y \leq 0.745$ is satisfied.

5. The light-emitting device described in claim 4, wherein $y \leq 0.72$ is satisfied.

6. The light-emitting device described in claim 3, wherein $0.35 \leq y$ is satisfied.

7. The light-emitting device described in claim 1, wherein the plurality of the sets of the pads are arranged in a plurality of lines in the circumferential direction of the rounded wiring board, and the surface-mounted LEDs are arranged to correspond to each of the sets of the pads, and
$y \leq -1.04x+1.80$ is satisfied in each line.

8. A method for manufacturing a light-emitting device comprising a flexible wiring board curved to a predetermined shape, a plurality of sets of pads mounted on a top surface of the flexible wiring board and arranged so as to form a line along a circumferential direction of a curved part of the curved wiring board having the predetermined curved shape, and a plurality of surface-mounted LEDs (light-emitting diodes) each of which is fixed to a top surface of each of the plurality of the sets of the pads respectively, the method comprising:
satisfying $y \leq -1.04x+1.80$, where L is a length of the circumference of the part where the plurality of the sets of the pads form the line on the curved wiring board, y (y=s/L) is a ratio of a total sum s of the lengths in the circumferential direction of the plurality of the sets of the pads to the circumferential length L, and x is a curvature of the part where the plurality of the sets of the pads form the line on the curved wiring board.

9. The light-emitting device described in claim 1, wherein each set of the pads includes a heat dissipating pad and a pair of electrical pads.

10. The light-emitting device described in claim 1, wherein a width in the circumferential direction of each of the pads is less than a length of each of the pads in a radial direction.

\* \* \* \* \*